US006630677B1

United States Patent
Zhao et al.

(10) Patent No.: US 6,630,677 B1
(45) Date of Patent: Oct. 7, 2003

(54) ELECTROSTATIC LENS HAVING GLASSY GRAPHITE ELECTRODES

(75) Inventors: Zhiyong Zhao, Austin, TX (US); David Hendrix, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 79 days.

(21) Appl. No.: 09/943,570

(22) Filed: Aug. 29, 2001

(51) Int. Cl.[7] .............................................. H01J 37/12
(52) U.S. Cl. .............................. 250/396 R; 250/492.21
(58) Field of Search .................... 250/396 R, 492.21

(56) References Cited

U.S. PATENT DOCUMENTS

| | | | | |
|---|---|---|---|---|
| 5,138,158 A | * | 8/1992 | Ninomiya et al. | 250/305 |
| 5,444,256 A | * | 8/1995 | Nagai et al. | 250/396 R |
| 5,869,838 A | * | 2/1999 | Stengl | 350/396 R |
| 6,291,828 B1 | * | 9/2001 | Saadatmand et al. | 250/492.21 |

* cited by examiner

Primary Examiner—Judy Nguyen
Assistant Examiner—Lam S Nguyen
(74) Attorney, Agent, or Firm—Toler, Larson & Abel, LLP

(57) ABSTRACT

An electrostatic lens with glassy graphite electrodes for use in an ion implanter is disclosed. The graphite electrodes have been manufactured to be substantially smooth (glassy) such that irregularities on the surface grain of the graphite, for example peaks or apexes, are no longer present. In an embodiment, employing polished graphite electrostatic lens electrodes does not require the time-consuming conditioning operations under vacuum that are typically needed with conventional graphite electrodes, and thus offers the advantage of increased uptime for an ion implantation system. In addition, because surface irregularities are not present to serve as discharge points for electrostatic buildup, the use of glassy graphite electrodes as disclosed offers the advantage of electrostatic discharge reduction. Reduction of electrostatic discharge results in decreased particulate contamination from discharge events, as well as lessening of the probability of irreparable physical damage to implantation target material.

35 Claims, 5 Drawing Sheets

ELECTROSTATIC LENS HAVING GLASSY GRAPHITE ELECTRODES

FIELD OF THE DISCLOSURE

The present invention relates generally to ion implantation, and more particularly to the use of polished graphite as Einzel lens electrodes for reducing electrostatic discharge of high voltage during an ion implantation process in semiconductor manufacturing.

BACKGROUND

Ion implantation uses charged particles (ions) to penetrate beneath a material's surface, which gives the material unique electronic, mechanical, or chemical properties. Ion implantation is deemed as a key technique in the semiconductor industry. It is also used in other manufacturing sectors for its demonstrated potential for hardening of surfaces and for enhancing the corrosion properties of metals.

Within the microelectronics industry, ion implantation techniques are used to introduce impurity atoms into semiconductors to alter the conductivity of the semiconductors in a controlled fashion. In ion implantation, electrically charged ions are accelerated under the action of an electric field and implanted into a solid target, i.e., a semiconductor wafer. Along with ions of the desired species, implanters sometimes inadvertently deposit contaminants onto wafer surfaces. These contaminants may be in the form of particles or ions and molecules of another species. The contaminants may be produced by the ion source and transported through the beamline, or generated by sputtering caused by energetic ions impinging on surfaces in the beamline, or caused by electrostatic discharges (arcing) within other components of the ion implantation system. Various implantation systems with capabilities for high current, high energy and low-energy ion implantation are available commercially, such as those manufactured by Axcelis Technologies, Inc., Applied Materials, Inc., and Varian Semiconductor Equipment Associates, to name a few.

One of the possible components of the optics system of an ion implantation system is an electrostatic lens, commonly called an Einzel lens, which aids in focusing the ion beam, and, in some cases, can be used for deceleration optics. Einzel lenses have electrodes which may be made of metal, metallic compounds, or high-purity graphite. Metal electrodes for Einzel lenses are not used for semiconductor devices (wafers) because undesirable metal contamination generated from the electrodes could result.

Generally, graphite Einzel electrodes are employed on ion implanters in instances when low energy (typically 10 keV or below) beams are extracted from the ion source, and where low contamination content is a requirement, as in the semiconductor manufacturing industry. The use of graphite electrodes eliminates the problem of metal contamination, however, standard high-purity graphite electrodes have surface irregularities such as peaks or apexes which exist on the surface of the graphite. Since tens of kilovolts may be applied to the electrodes during an implant operation, these surface irregularities often lead to electrostatic discharges (arcing) from the electrodes, which results in high particulate contamination of the implanted wafers. In some cases, wafers damaged by an electrostatic discharge cannot be repaired due to the physical nature and extent of the damage. In addition, moisture may be trapped within the surface irregularities present on the electrode, which creates an additional impurity problem.

These problems are generally addressed by conditioning the electrodes (under vacuum) through techniques such as photoresist outgassing, or the use of an argon beam through the lenses to remove moisture and other impurities which may be present on the surface of the graphite. However, this conditioning process typically takes more than one week, during which time the implantation system is unavailable for low energy production work.

Given the aforementioned limitations of conventional Einzel lenses used in ion implantation systems, it is apparent that an Einzel lens which overcomes the particulate contamination problems without rendering the implantation device unavailable for extended periods of time is needed.

BRIEF DESCRIPTION OF THE DRAWINGS

Various objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures, and wherein:

DETAILED DESCRIPTION OF THE FIGURES

FIGS. 1–5 describe an electrostatic lens with highly-polished graphite electrodes in an ion implanter, and a method for use. The graphite electrodes as disclosed herein have been manufactured to be substantially smooth (glassy) such that irregularities on the surface grain of the graphite, for example peaks or apexes, are greatly reduced or no longer present. Conventional graphite electrodes have an average surface roughness (Ra) of about 0.15 to 0.20 microns, with peak-to-peak variations on the order of 20 to 30 micro s. In an embodiment of the present disclosure, the glassy, high-polish graphite electrodes may have a surface roughness (Ra) of about 10 Angstroms, with peak-to-peak variations being less than about 0.1 microns. In comparison, the Ra of a silicon wafer is about 2 Angstroms. In an embodiment, use of glassy graphite electrostatic lens electrodes does not require the time-consuming conditioning operations under vacuum that are typically needed with conventional graphite electrodes, eg., photoresist outgassing. The use of glassy electrodes as disclosed thus offers the advantage of increased uptime for an ion implantion system, which translates to increased productivity and decreased operating costs in a production environment such as semiconductor fabrication. In addition, because surface irregularities are reduced or not present to serve as discharge points for electrostatic buildup, the use of glassy graphite electrodes as disclosed offers another advantage over conventional graphite electrodes, namely that of electrostatic discharge reduction. Reduction of electrostatic discharge results in decreased particulate contamination from discharge events, as well as lessening of the probability of irrepairable physical damage to the semiconductor material.

Figure 1:
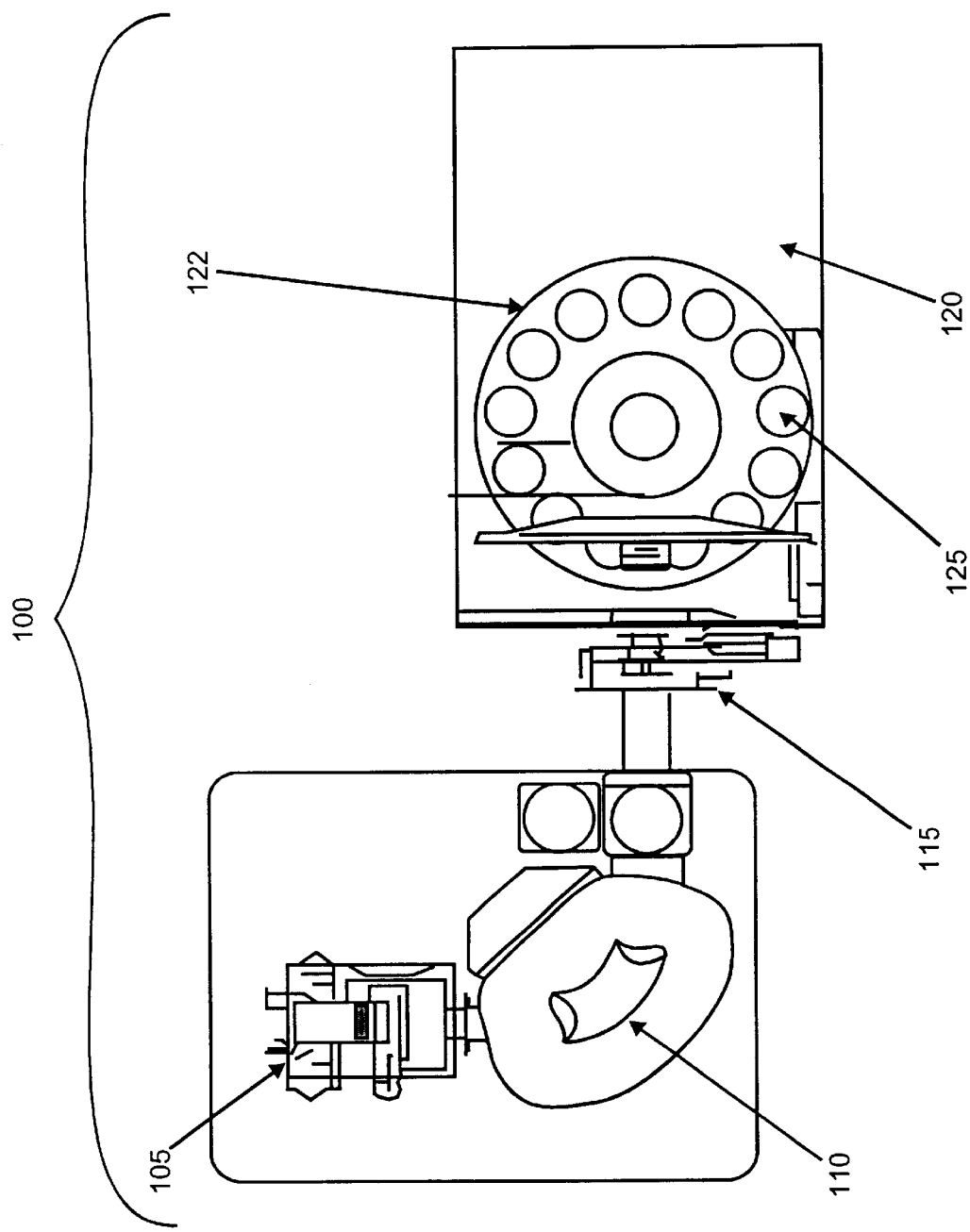
FIG. 1 is a simplified diagram of an ion implanter showing incorporation of an electrostatic lens system according to at least one embodiment of the present invention.

Referring now to FIG. 1, a simplified block diagram of a typical ion implanter showing incorporation of an electrostatic lens system according to an embodiment of the present disclosure is presented, and designated generally as ion implantion system 100. Ion implantation system 100 includes an ion source 105 for converting a gas or a solid material into an ion beam, a beamline and mass analyzing magnet assembly 110 for filtering ions from the beam, electrostatic (Einzel) lenses 115 for focusing ions in the beam during lower energy operations (10 keV or below), and an end station 120 with a rotating disk 122 for supporting semiconductor wafers 125 or other target workpieces in the path of the ion beam so that the desired species are implanted into semiconductor wafers 125. In other embodiments, wafer 125 is not necessarily mounted on a rotating disk 122, but may be mounted on any suitable wafer support device. End station 120 typically includes automated equipment for introducing and removing wafers 125 into and from ion implanter 100, as well as a console for operating/monitoring/measuring the various parameters of ion implanter 100, e.g., dose measurements, beam current, lens current, et cetera.

Ion implantation system 100 includes additional components well known to those of skill in the art which are not shown in FIG. 1. For example, terminal electronics, gas box, power distribution components, vacuum components, power supplies for extraction, focusing, acceleration or deceleration, and the like are not shown. It should be noted that the complete pathway traversed by the ion beam is evacuated (under vacuum) during ion implantation operations. Depending upon the particular implanter manufacturer, the ion beam may be distributed over the target area by beam scanning, by target movement, or by a combination of beam scanning and target movement. A variety of ion implantation systems are available commercially which can be modified to practice the teachings disclosed herein, for example implanters manufactured by Varian Semiconductor Equipment Associates, Axcelis Technologies, Inc., Applied Materials, Inc., and others.

Figure 2:
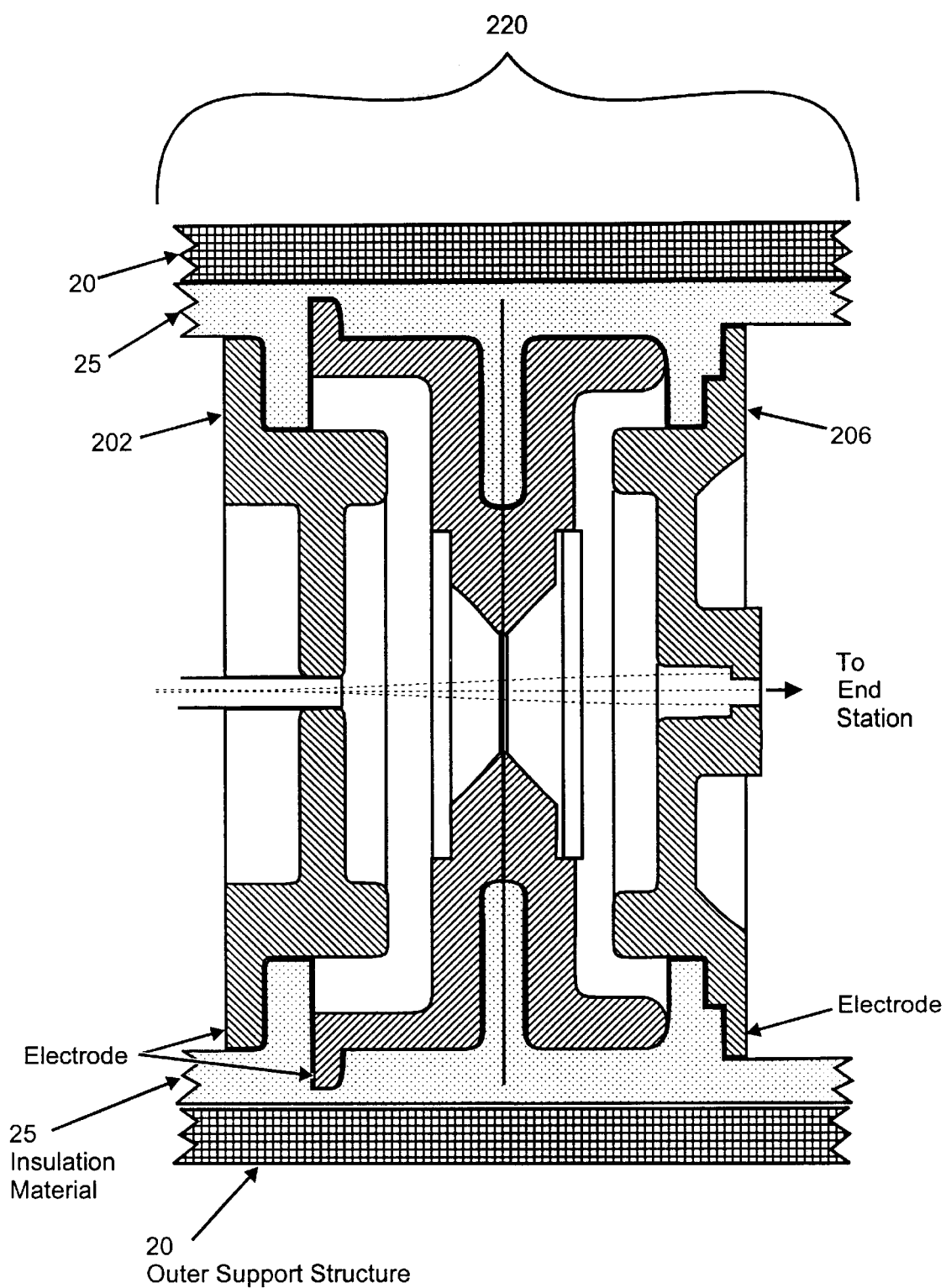
FIG. 2 is a simplified diagram of an Einzel lens assembly according to at least one embodiment of the present invention.

Referring now to FIG. 2, a simplified top cut away view of an Einzel lens assembly according to at least one embodiment of the present invention will be discussed. In the embodiment of FIG. 2, the electrostatic (Einzel) lens assembly includes an outer support structure 20, and insulating material 25 positioned inside outer support structure 20. A single Einzel lens 220 is shown in an enlarged view. In an embodiment, a plurality of electrodes having a surface of glassy graphite, such as 203, 205, and 207, define an outer limit of an opening through which a charged-particle beam 201 passes. Even though the electrodes shown in FIG. 2 are of the plate type, the method described herein may utilize a range of electrostatic lens electrode configurations, i.e., plate, annular, field composable, and others, so long as the electrostatic lens configurations are compatible with other beam line elements of the implantation system.

Figure 3:
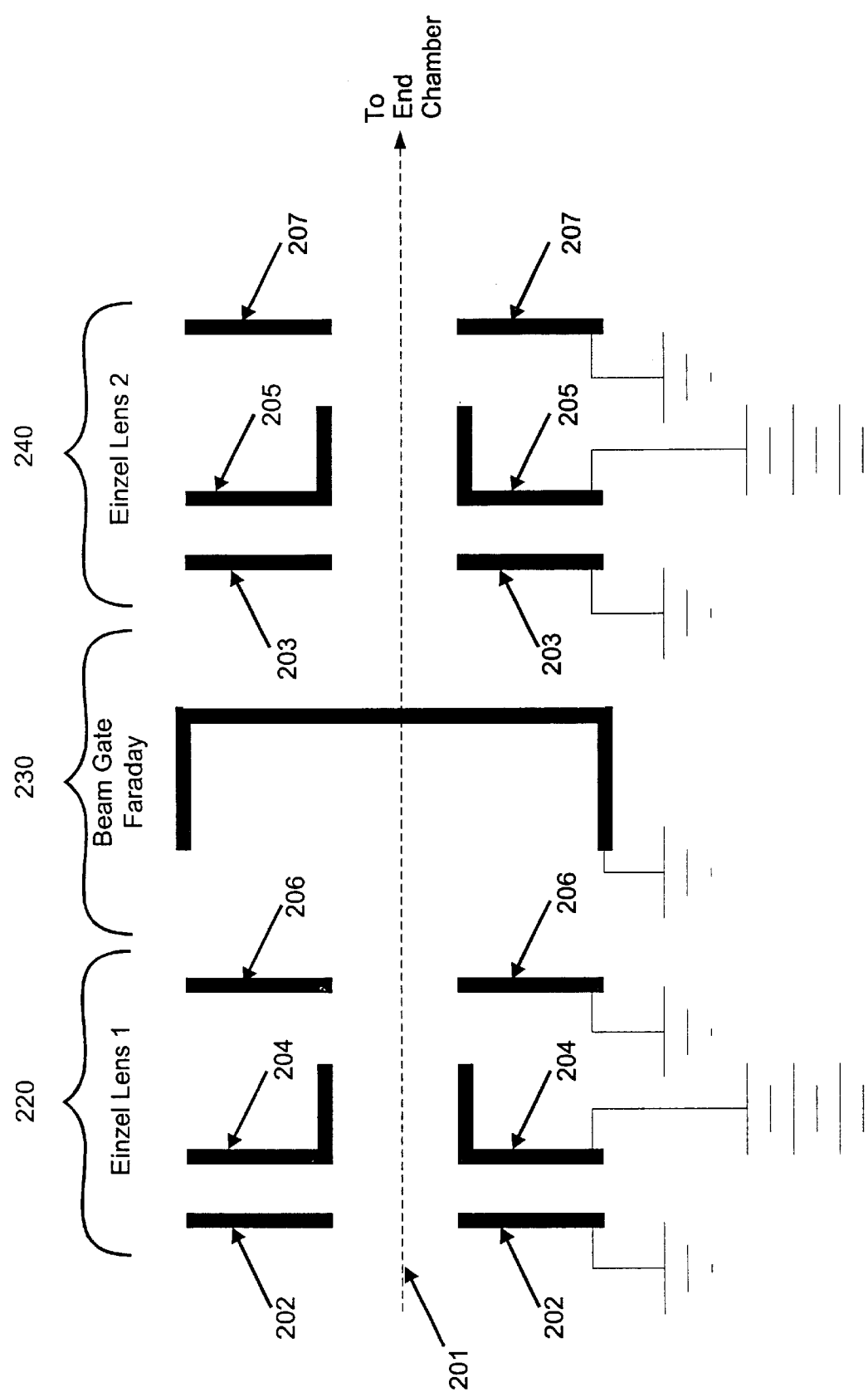
FIG. 3 is a simplified schematic diagram of an electrostatic lens system according to at least one embodiment of the present invention.

A simplified schematic diagram of an electrostatic (Einzel) lens system according to an embodiment of the present disclosure is shown in FIG. 3. Like elements in FIGS. 2 and 3 have the same reference numerals. The Einzel lens configuration depicted in FIG. 3 is similar to that used in Varian Ion Implant Systems VIISion series implanters, and is offered as an example of an Einzel (electrostatic) lens configuration which may be modified to practice the teachings disclosed herein. However, it should be noted that a variety of other Einzel lens system configurations are obtainable from other manufacturers which could be modified tot practice the teachings of the various embodiments as disclosed herein. The electrostatic lens system, or, more generally, ion optics system for adjusting the geometric characteristics of the charged-particle or ion beam 201 presented in FIG. 3 includes two Einzel lenses. A first Einzel lens 220 may be positioned on a charged-particle beam 201 receiving side, and a second Einzel lens 240 may be positioned on a charged-particle beam 201 emitting side. A set of electrodes 202, 204, and 206 form the Einzel lens 220 on the charged-particle beam 201 receiving side, while another set of electrodes 203, 205, and 207 form the second Einzel lens 240 on the charged-particle beam 201 emitting side. A Faraday system 230 may be positioned between the two Einzel lenses 220 and 240. The Faraday system 230 is used in connection with measurements of ion beam 201.

A difference in potential is maintained between central electrode 204 and the two electrodes 202 and 206 surrounding the central electrode 204. The same applies to central electrode 205 and its two surrounding electrodes 203 and 207. This configuration of an ion adjustment optics system, in which the two electrodes surrounding the central electrode are at the same potential, prevents loss of energy as ion beam 201 passes through the ion optics system, and aids in shaping of the ion beam 201 diameter and focusing with regard to ion beam's 201 object focal point. Normally, this focusing onto the object focal point of a scanning element component (not shown) of an implanter is accomplished by combining adjustment of the supply high voltage for the ion source with adjustment of the supply voltage for the central electrodes 204, 205 of Einzel lenses 220 and 240.

An embodiment of the present disclosure provides for the focusing electrodes such as 202, 204, 206, within Einzel lens 220, and 203, 205 and 207 within Einzel lens 240 to be manufactured of high-purity graphite in a manner which results in the surface being substantially smooth (glassy) such that surface irregularities in the surface grain of the graphite are considerably reduced or not present. In another embodiment, only those electrodes such as 203, 205, and 207 of Einzel lens 240 (on the beam emitting side closest to the wafers) need be of glassy construction. The same favorable returns accrue in either instance: use of glassy graphite electrostatic lens electrodes does not require time-consuming conditioning operations needed with conventional graphite electrodes, and electrostatic discharges (lens arcings) are substantially reduced over that of conventional graphite electrodes. In practice, it has been found that the operational lens current may be decreased from 0.3 milli-Amperes to less than 0.01 milliAmperes when using glassy graphite Einzel lens electrodes when used in a VIISion implantation system. And, as a beneficial side effect, reduced lens current means reduced lens arcing. Thus the use of glassy graphite electrodes within an Einzel lens system as disclosed in the various embodiments herein results in lower particulate contamination levels than that currently obtainable by use of only conventional graphite electrodes.

Figure 4:
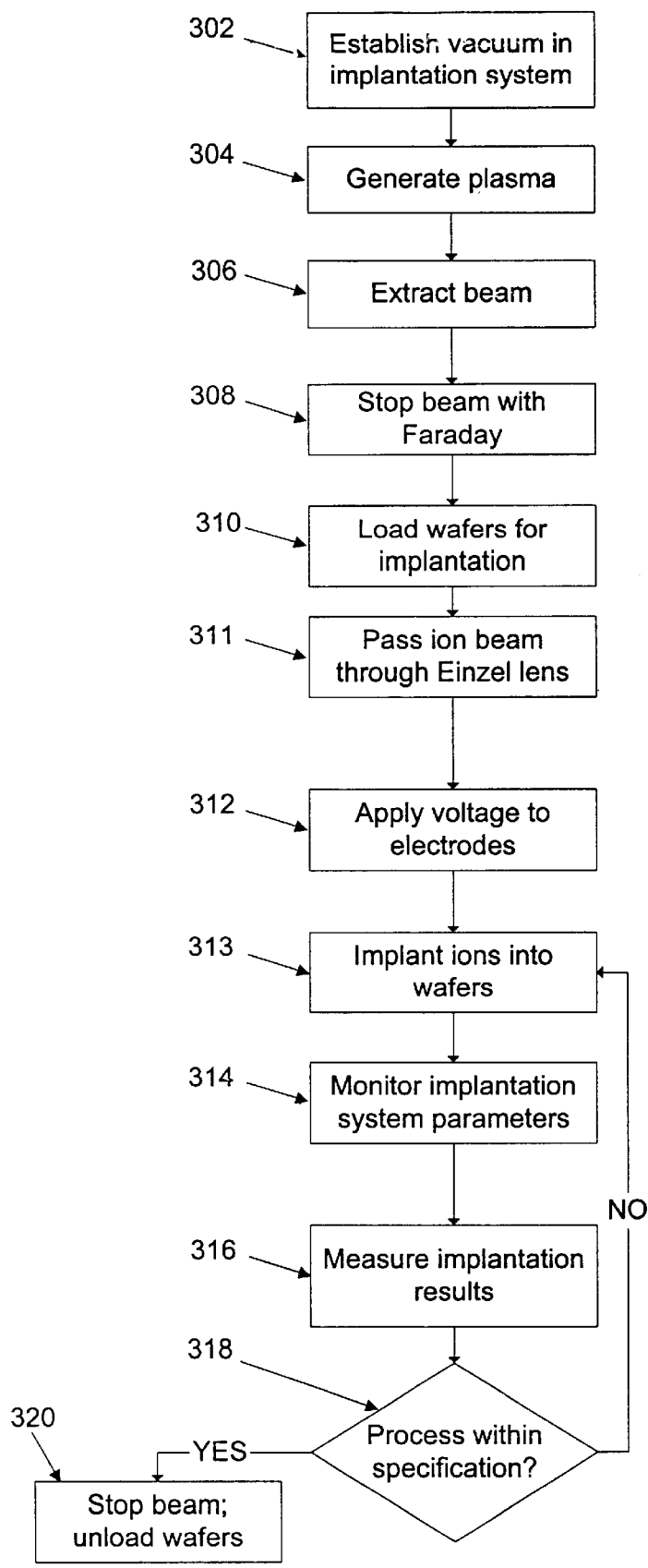
FIG. 4 is a flow diagram of an ion implantation process according to at least one embodiment of the present invention.

An example of a typical utilization of an electrostatic (Einzel) lens system according to an embodiment of the present disclosure is shown in FIG. 4, a flow diagram of an ion implantation process in a semiconductor manufacturing environment. A state of high vacuum must be established within the implantation system, as seen in step 302, before a plasma can be generated in step 304. Once the plasma is genreted, a charged-particle (ion) beam is extracted in step 306. The transmission of the charged-particle beam is temporarily halted with a Faraday system in step 308 to enable loading of the semiconductor wafers into the end chamber of the implanter, as in step 310. The charged-particle (ion) beam is passed through the Einzel lens system in step 311, and voltage is applied to the electrodes to focus the beam in step 312. It should be noted that the electrodes in the Einzel lens are of the glassy graphite type as disclosed herein. In step 313, ions are implanted into the wafers, and the Einzel lens current and charged-particle beam current are monitored in step 314.

In an embodiment, the monitoring in step 314 may be accomplished in real time, concurrent with implantation occurring in step 312. In step 316, the results of the implantation are measured. Step 316 may include, for example, determination of the number of defects added to a monitor wafer, as well as the amount of charge put into a wafer by ions from the implantation process. Should the measurement results indicate that the implantation process is within the desired specifications in step 318, the ion beam would be stopped with the Faraday system and the wafers would be unloaded in step 320. If the process is determined not to be within specifications in step 318 due to insufficient ion implantation, the process would resume at step 313, with additional ion implantation. Some of the steps described in FIG. 4 may be performed in a different sequence than disclosed. In addition, some steps may be performed concurrently with other steps, and the various phases disclosed may be altered to include additional, fewer, or different steps, actions, and/or functions. For example, if arcing from the electrostatic lens electrodes occurs, the process would be halted and the wafers checked for particulate contamination or damage, and the wafers reworked, if possible.

Figure 5:
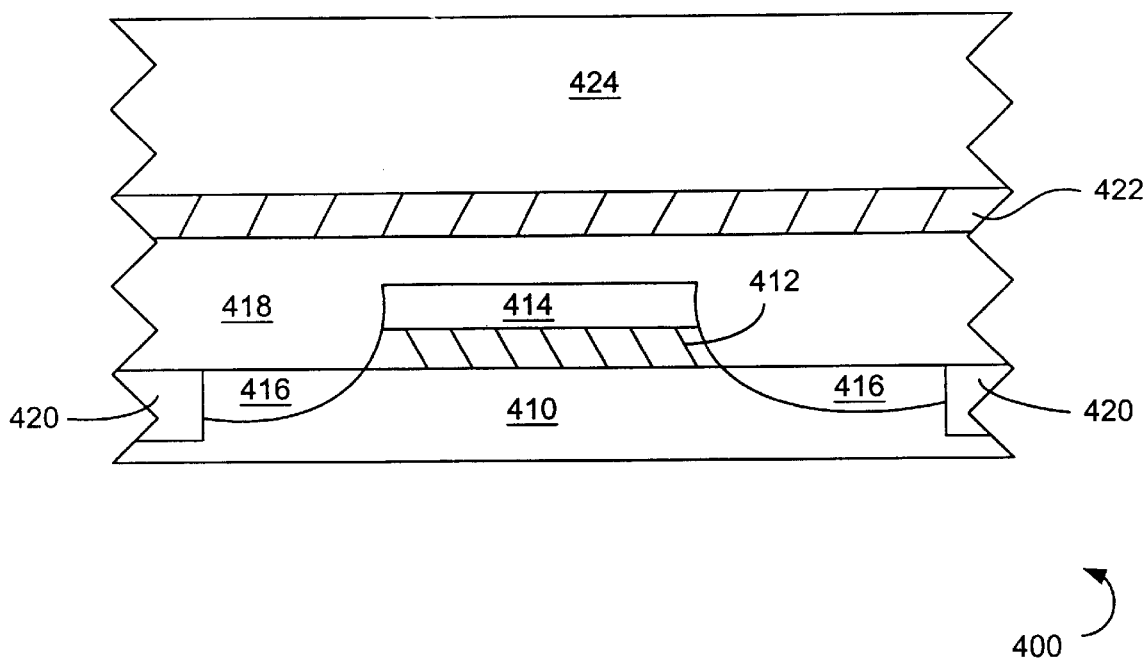
FIG. 5 is an illustration of a representative semiconductor device formed using the method according to at least one embodiment of the present invention.

Referring now to FIG. 5, an illustration of a representative semiconductor device formed using the method as provided in an embodiment of the present invention is discussed. Semiconductor device 400 includes a semiconductor substrate 410, gate dielectric 412, gate electrode 414, doped regions 416, dielectric layer 418, isolation regions 420, metal layer 422, and a passivation layer 424. It will be appreciated by one skilled in the art that the processes used to form a semiconductor device as in FIG. 5 may employ the glassy graphite electrodes in an Einzel lens system as described in the various embodiments herein. For example, an ion implanter employing the teachings of the present disclosure could be used to implant dopants into doped regions 416.

It should be noted that the example provided as an embodiment of the present disclosure is not intended to specifically define which processing techniques using charged particle beams or ion implantation devices may be conducted. Other reduced energy applications requiring the use of an electrostatic lens system with similar requirements for low particulate contamination and/or reduction in electrostatic discharges may be practiced according to the teachings of the present disclosure. The methodology as embodied herein is not dependent upon a specific manufacturer's ion implantation device, nor upon a specific conditioning, maintenance, or calibration process, and thus may be incorporated into an assortment of other production environments which utilize ion optic adjustment components in ion implantation systems.

The method and apparatus herein provides for a flexible implementation. For example, the disclosure is discussed herein primarily with regard to reduction of electrostatic discharges in an ion implantation device in a semiconductor fabrication process however, other manufacturing sectors requiring electrostatic discharge reduction in an ion implantation process may incorporate the teachings as disclosed herein within the operational parameters of their respective implantation system(s). Additionally, various types of lens designs are currently available which could be adapted for use in employing the method as taught herein. Note also, that although an embodiment of the present invention has been shown and described in detail herein, along with certain variants thereof, many other varied embodiments that incorporate the teachings of the invention may be utilized and that logical, mechanical, chemical and electrical changes may be made without departing from the spirit or scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. An electrostatic lens comprising:
   an outer support structure;
   an insulator positioned inside said outer support structure; and
   a plurality of electrodes positioned inside said insulator and defining an outer limit of an opening through which a charged-particle beam can pass, said plurality of electrodes having a surface of glassy graphite comprising a surface roughness less than about 0.15 microns.

2. The electrostatic lens as in claim 1, wherein the plurality of electrodes includes:
   a first set of electrodes positioned on a charged-particle-beam receiving side of said opening; and
   a second set of electrodes positioned on a charged-particle-beam emitting side of said opening.

3. The electrostatic lens as in claim 2, wherein:
   the plurality of electrodes further includes at least a third set of electrodes interposed between said first set of electrodes and said second set of electrodes; and wherein
   said first set of electrodes and said second set of electrodes have the same electric potential, and said third set of electrodes has an electric potential adjustable to control focus of the charged-particle beam.

4. The electrostatic lens as in claim 1, wherein the electrostatic lens is configurable for use in an ion implantation device.

5. The electrostatic lens as in claim 1, wherein the plurality of glassy graphite electrodes have a surface roughness of about 10 Angstroms.

6. The electrostatic lens as in claim 1, wherein the glassy graphite is substantially free of peaks large enough to cause arcing at operational voltages.

7. The electrostatic lens as in claim 1, wherein the glassy graphite electrodes have peak-to-peak variations of less than about 0.1 microns.

8. The electrostatic lens as in claim 1, wherein the glassy graphite electrodes have peak-to-peak variations of less than about 20 microns.

9. The electrostatic lens as in claim 1, wherein the plurality of electrodes can operate with a lens current of less than 0.3 milliAmperes.

10. The electrostatic lens as in claim 1, wherein the plurality of electrodes can operate with a lens current of less than 0.01 milliAmperes.

11. The electrostatic lens as in claim 1, wherein the plurality of electrodes can be used without conditioning.

12. A method comprising:
passing a charged-particle beam through an electrostatic lens; and
applying an electric potential to focusing electrodes of the electrostatic lens, wherein a surface of the focusing electrodes is glassy graphite comprising a surface roughness less than about 0.15 microns.

13. The method as in claim 12, further including the step of passing a charged-particle beam through a lens assembly having a plurality of lenses.

14. The method as in claim 12, wherein the focusing electrodes of an electrostatic lens closest to an emitting side of the lens assembly have a surface of glassy graphite.

15. The method as in claim 12, further including the step of using the charged-particle beam to implant ions in a semiconductor wafer.

16. The method as in claim 12, wherein the energy of the charged-particle beam is no greater than about 10 keV.

17. The method as in claim 12, wherein the surface of the glassy graphite electrodes has a surface roughness of about 10 Angstroms.

18. The method as in claim 12, wherein the glassy graphite is substantially free of peaks large enough to cause arcing at operational voltages.

19. The method as in claim 12, wherein the glassy graphite has peak-to-peak variations of less than about 0.1 microns.

20. The method as in claim 12, wherein the glassy graphite electrodes have peak-to-peak variations of less than about 20 microns.

21. The method as in claim 12, wherein the plurality of electrodes can operate with a lens current of less than 0.3 milliAmperes.

22. The method as in claim 12, wherein the plurality of electrodes can operate with a lens current of less than 0.01 milliAmperes.

23. The method as in claim 12, wherein the plurality of electrodes can be used without conditioning.

24. A system comprising;
a charged-particle beam generator; and
an electrostatic lens including:
an outer support structure;
an insulator positioned inside said outer support structure; and
a plurality of electrodes positioned inside said insulator and defining an outer limit of an opening through which a charged-particle beam can pass, said plurality of electrodes having a surface of glassy graphite comprising a surface roughness less than about 0.15 microns.

25. The system as in claim 24, wherein the system is an ion implantation device.

26. The system as in claim 24, wherein the charged-particle beam generated is no greater than about 10 keV.

27. The system as in claim 24, wherein the plurality of electrodes includes:
a first set of electrodes positioned on a charged-particle-beam receiving side of said opening; and
a second set of electrodes positioned on a charged-particle-beam emitting side of said opening.

28. The system as in claim 24, wherein:
the plurality of electrodes further includes at least a third set of electrodes interposed between said first set of electrodes and said second set of electrodes; and wherein
said first set of electrodes and said second set of electrodes have the same electric potential, and said third set of electrodes has an electric potential adjustable to control focus of the charged-particle beam.

29. The system as in claim 24, wherein the glassy graphite is substantially free of peaks large enough to cause arcing at operational voltage.

30. The system as in claim 24, wherein the glassy graphite electrodes have peak-to-peak variations of less than about 20 microns.

31. The system as in claim 24, wherein the glassy graphite has peak-to-peak variations of less than about 0.1 microns.

32. The system as in claim 24, wherein the surface of the glassy graphite electrodes has a surface roughness of about 10 Angstroms.

33. The system as in claim 24, wherein the plurality of electrodes can operate with a lens current of less than 0.3 milliAmperes.

34. The system as in claim 24, wherein the plurality of electrodes can operate with a lens current of less than 0.01 milliAmperes.

35. The system as in claim 24, wherein the plurality of electrodes can be used without conditioning.

* * * * *